DENOMINATIONAL SWITCHING STAGE

Filed Feb. 16, 1967

Günther Hoffmann
INVENTOR.

BY

Karl F. Ross
Attorney

July 1, 1969 G. HOFFMANN 3,453,542

DENOMINATIONAL SWITCHING STAGE

Filed Feb. 16, 1967 Sheet 2 of 2

Günther Hoffmann
INVENTOR.

BY

Karl F. Ross
Attorney

United States Patent Office 3,453,542

Patented July 1, 1969

3,453,542

DENOMINATIONAL SWITCHING STAGE

Günther Hoffmann, Eningen, Germany, assignor to Wandel u. Goltermann, Kommanditgesellschaft, Reutlingen, Germany, a corporation of Germany Filed Feb. 16, 1967, Ser. No. 616,703
Claims priority, application Germany, Feb. 16, 1966, W 40,943
Int. Cl. G01r 23/14
U.S. Cl. 324—79 10 Claims

ABSTRACT OF THE DISCLOSURE

Switching stage for multidenominational (e.g. decadic) frequency synthesizer or analyzer wherein each stage receives an input frequency expressed as a multidigit number with one or more invariable digits followed by one or more significant digits, to be converted into an output frequency of the same order of magnitude with a new significant digit to be inserted between the invariable and significant digits of the input frequency. In a decadic system, each stage comprises a frequency divider of step-down ratio 10:1 to reduce input frequency of, say, 5.42 mHz. (5 being the invariable digit) to 0.542 mHz., the latter frequency being applied to a phase discriminator which also receives a substantially identical frequency from the output of a mixer combining the outputs of two voltage-responsive variable oscillators upon a proper tuning of the first of these oscillators to the desired output frequency of, say, 5.742 mHz. (7 being the new significant digit). With the operating frequency of the first oscillator variable between 5.000 and 5.999 mHz., the second oscillator is presettable in steps of 0.1 mHz. to ten discrete frequencies ranging from 4.5 mHz. (0.9 times the lower range limit of the first oscillator) to 5.4 mHz. (0.9 times the upper range limit of the first oscillator), depending upon the value of the new significant digit selected. In the assumed case, the second oscillator is stabilized at an output frequency of 5.2 mHz. to make the difference between the steady-state output frequencies of the two oscillators equal to 5.742—5.2=0.542 mHz. which corresponds to the output frequency of the frequency divider; the phase discriminator then has a substantially constant output voltage of the proper magnitude to hold the first oscillator at its desired operating frequency, any incipient deviation therefrom resulting in a corrective variation of that output voltage. The second oscillator can be held at its own operating frequency of, say, 5.2 mHz. by a feedback circuit which includes another phase discriminator comparing the last-mentioned frequency with a fixed reference frequency (e.g. of 0.1 mHz.), the resulting feedback voltage being also applied to the first oscillator to pretune same to a frequency on the order of 1.1 times the frequency of the second oscillator (thus, approximately 5.7 mHz.), with final tuning performed either by the first-mentioned phase discriminator or by a frequency-difference detector connected in parallel therewith.

My present invention relates to a system for producing a stabilized oscillation of selected frequency, to be used particularly as a denominational (e.g. decadic) switching stage in a multidenominational frequency synthesizer or analyzer wherein each stage receives an input frequency expressed as a multidigit number (e.g. on the order of megahertz) to be converted into an output frequency of the same order of magnitude. Such frequency converters are useful, e.g. in telemetery, to generate or to register signaling frequencies whose magnitude represents the information to be conveyed.

The general object of this invention is to provide a system of the character described which has a highly stable output frequency derived from a given input frequency under the control of a selector with $n$ different settings, $n$ being the denominational base of the multidigit frequency value and being thus equal to ten in a decadic system.

A more specific object of my invention is to provide simple but highly effective circuitry for the stabilization of the selected output frequency in such system.

It is also an object of this invention to provide means in such system for switching from synthesizing to analyzing and vice versa.

The invention is broadly applicable to any system whose input frequency can be expressed as a multidigit number N (of base $n$) with $k$ significant digits preceded by one or more invariable digits, the corresponding output frequency N' having the same invariable digit or digits followed by $k+1$ significant digits as a result of a shifting of each of the original significant digits into the next-lower denominational order and introducing a selected further digit in the denominational order immediately following the last invariable digit which has been vacated by the shifting process. For this purpose, in accordance with my invention, the input frequency is first applied to a frequency divider with a step-down ratio of $n$:1 whose output is fed to a phase discriminator which also receives a substantially identical frequency from the output of a mixer combining the outputs of two voltage-responsive variable oscillators upon a proper tuning of the first of these oscillators to the desired output frequency. The second oscillator is presettable, under the control of an associated selector, to one of $n$ discrete frequencies $f_n$ which range in digital steps between $(n-1)f_1/n$ and $(n-1)f_2/n$ (i.e. 0.9 $f_1$ and 0.9 $f_2$ with decimal numbers) where $f_1$ and $f_2$ are the lower and upper limits of the operating range of the first oscillator; these limits, in turn, are defined by the minimum and maximum values of the denominational order to be refilled, corresponding thus to the numerical value of the input frequency N with all the significant digits equal to 0 or $n-1$, respectively. Upon substractive combination of the outputs of the two oscillators during steady-state operation, therefore, the output of the mixer will be exactly equal to the output of the frequency divider so that the phase discriminator receiving these two outputs will produce a constant D-C voltage of a level dependent upon the relative phase of these two identical frequencies. Since this voltage level must be so chosen as to maintain the first oscillator operating at the selected output frequency, the system will approach its steady state at a time when the two frequencies in the input of the phase discriminator are almost but not quite identical so that their relative phase still shifts up to the instant when the phase angle is such as to produce the correct control voltage in the discriminator output. Thereafter, any incipient drift of the output frequency of the controlled oscillator will give rise to a corrective variation of the discriminator voltage.

The same principle of stabilization with the aid of a phase discriminator can be used, pursuant to another feature of my invention, in conjunction with the second oscillator which feeds the mixer controlling the first oscillator. Thus, another phase discriminator supplied with the output of the second oscillator and with a fixed reference frequency $f_o$ may produce a feedback voltage designed to correct deviations of the operating frequency of the second oscillator from the one of its $n$ possible values to which it has been adjusted by the associated selector; the same feedback voltage, pursuant to a further feature of my invention, may be utilized to present the first oscillator to a frequency on the order of $(n+1)/n$ times the frequency of the second oscillator (i.e. 1.1 times that frequency in a decadic system), this pretuning corresponding to the newly introduced significant digit so that final tuning of the first oscillator under the control of the first phase discriminator will be required only for the significant digits of the lower denominational orders. Such final tuning may be facilitated by connecting, according to still another feature of the invention, a frequency-difference detector in parallel with the first frequency discriminator whereby the latter becomes effective only upon the system approaching steady-state operation; a similar frequency-difference detector may also be connected in parallel with the phase discriminator serving to stabilize the second oscillator.

The use of a frequency-difference detector in conjunction with at least the first oscillator enables the utilization of the associated phase discriminator as a source of variable voltage which can be utilized, in accordance with yet a further feature of my invention, to generate monitoring signals if the first oscillator is concurrently wobbled by a source of varying control voltage (e.g. a sawtooth wave) to shift its operating frequency within a range corresponding to a unit value of one of the lower denominational orders, i.e. those occupied by significant digits. The monitoring signal furnishes an indication of the magnitude of one or more lower-order significant digits and may thus be utilized for read-out or calibration purposes.

In a particularly advantageous embodiment the selector controlling the second oscillator may comprise a frequency divider connected between the output of that oscillator and the associated phase discriminator, this frequency divider being adjustable to one of $n$ different stepdown ratios $p$:1 where $p$ is equal to the ratio $f_n/f_o$; this arrangement thus reduces the output frequency of the second oscillator to the value $f_o$ and thus enables direct phase comparison with the fixed reference frequency.

The invention will now be described in greater detail with reference to the accompanying drawing in which.

Figures 1, 4:
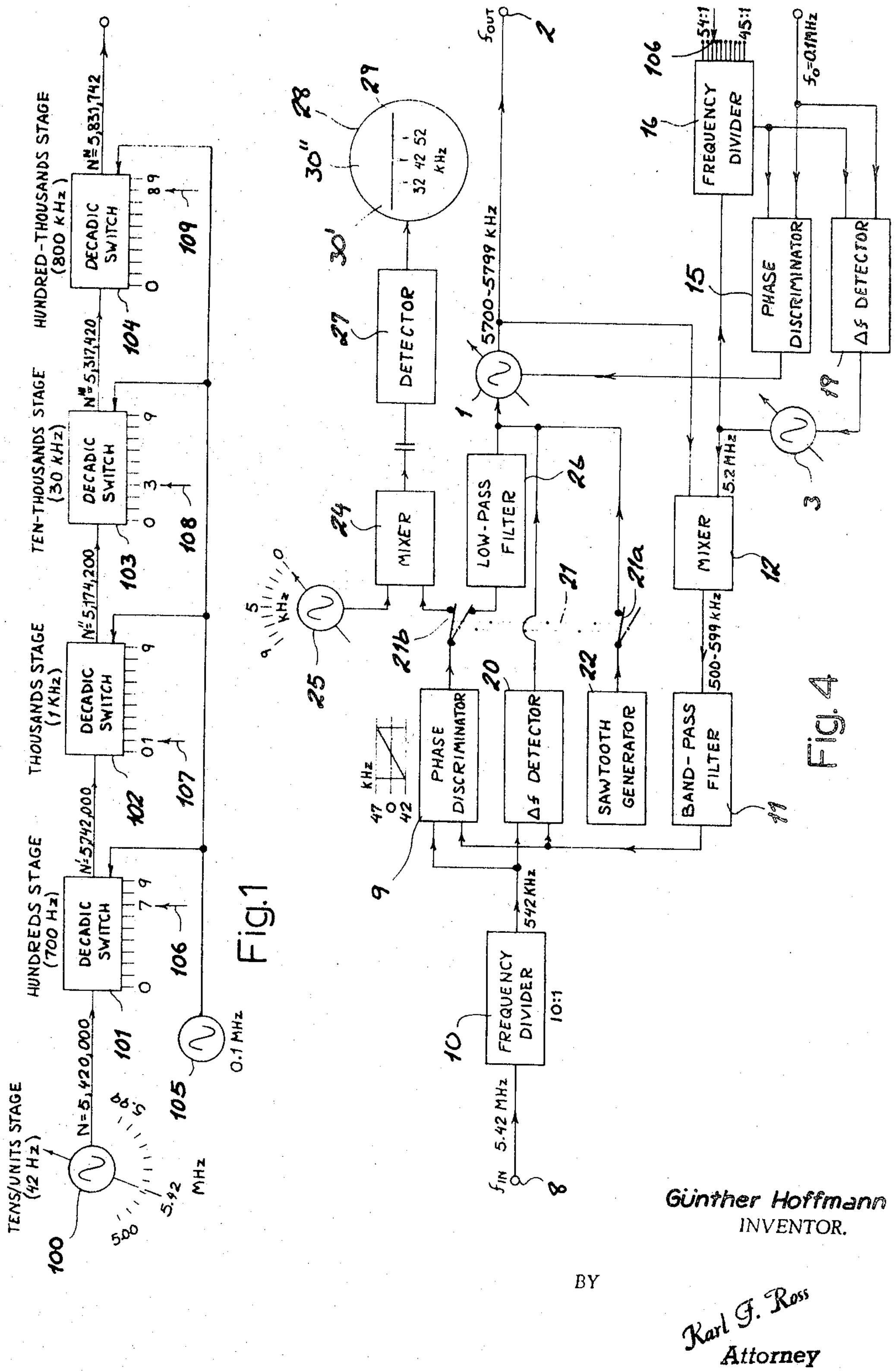
FIG. 1 is a circuit diagram of a multistage decadic frequency converter embodying the invention.
FIG. 4 is another circuit diagram showing the system of FIG. 3 modified for switchover from a locking-in position to a reading position.

In FIG. 1 I have illustrated a decadic frequency converter adapted for the synthesis of a frequency whose numerical value may be any integer between 5,000,000 and 5,999,999 Hz. The system comprises an input stage in the form of a variable-frequency generator 100 which can be selectively adjusted to any one of 100 operating frequencies ranging from 5.00 to 5.99 mHz. The output frequency of this generator, here chosen as 5,420,000 Hz., may thus be represented as a 7-digit number in the decimal system, with an invariable highest-order digit (5) followed by two significant digits (42). In a first intermediate stage 101, this frequency of numerical value N is converted into a frequency of numerical value N′ of the same order of magnitude, chosen in this particular example as equal to 5,742,000 Hz.; it will thus be seen that the two significant digits (42) have been shifted to the next-lower denominational orders, i.e. from the sixth and fifth decades to the fifth and fourth decades, respectively, thus vacating the sixth decades which has been occupied by a new significant digit (7). In a second intermediate stage 102, the frequency N′ is analogously converted into a frequency N″=5,174,200 Hz.; and two further switching stages 103, 104 respectively result in a frequency $N'''$=5,317,420 Hz. and $N^{iv}$= 5,831,742 Hz., the latter frequency being the final output of the system.

As will be apparent from the foregoing, the setting of generator 100 determines the tens and units digits (42 Hz.) of the final output frequency, stage 101 selects the hundreds digits (700 Hz.), stage 102 determines the thousands digit (1 sHz.), stage 103 established the ten-thousands digit (30 Hz.) and stage 104 chooses the hundred-thousands digit (80 kHz). The digits thus selected in stages 101–104 are, however, invariably in the same (sixth) decade of the respective output frequency, i.e. one of the first ten harmonics of a reference frequency $f_o$ (0.1 mHz.), so that this reference frequency can be supplied to all four of these stages from a common fixed-frequency generator 105, preferably a crystal-controlled oscillator. The selector inputs to the several intermediate stages 101, 102, 103, 104 have been indicated at 106, 107, 108, 109, respectively.

Figure 2:
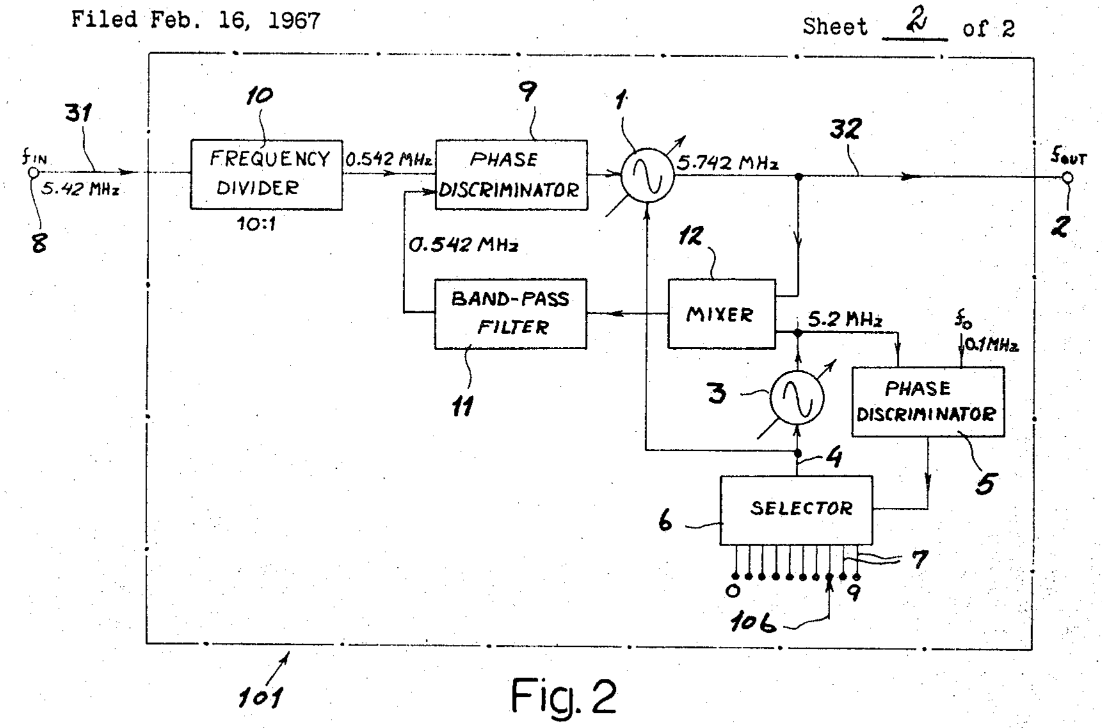
FIG. 2 is a circuit diagram of one of the stages of the system of FIG. 1.

In FIG. 2 I have illustrated one of the four switching stages of FIG. 1, specifically the stage 101 which is also representative of stages 102, 103 and 104. An input frequency $f_{in}$ of 5.42 mHz. is applied to a terminal 8 on an incoming line 31 which leads to a frequency divider 10 having a stepdown ratio of 10:1. A phase discriminator 9 receives, on one of its inputs, the output frequency of divider 10 having a magnitude of 0.542 mHz. A first or principal oscillator 1 and a second or auxiliary oscillator 3, both electronically adjustable in response to a control voltage, work into a mixer 12 whose output, representing the difference of its input frequencies, is delivered via a bandpass filter 11 to the second input of phase discriminator 9. The operating frequency of oscillator 1 also appears on an outgoing line 32 and constitutes an output frequency $f_{out}$ available on a terminal 2. A voltage selector 6 has a bank of input terminals 7 which can be individually connected to a source of operating potential by a wiper 106 representing the similarly designated control element of FIG. 1. Selector 6 is also connected in a feedback circuit which includes a second phase discriminator 5 having inputs respectively energized from the output of oscillator 3 and from the source 105 (FIG. 1) of reference frequency $f_o$=0.1 mHz. The output circuit 4 of selector 6 carries a control voltage which has a fixed component determined by the setting of selector 6 and a variable component represented by the feedback voltage from phase discriminator 5.

The control voltage from circuit 4 is applied to both oscillators 1 and 3 in parallel. While these oscillators may be of substantially identical construction, they are designed to work in different frequency ranges in response to a given control voltage, the frequency range of oscillator 1 (in the absence of a supplemental input voltage from phase discriminator 9) being about 10% higher than that of oscillator 3.

In the following description of the operation of the switching stage shown in FIG. 2 it will be assumed that wiper 106 stands on the 7th bank contact 7 of selector 6, in conformity with the value of the new digit (7) to be introduced at this stage. The operating range of oscillator 3 extends from 4.5 mHz. (equaling 0.9 times the lowest input frequency $f_{in}$ of 5 mHz.) to 5.4 mHz. (corresponding to 0.9 times the highest value of $f_{in}$, i.e. 5.99≈6 mHz.), respectively selectable by wiper 106 on the No. 0 and No. 9 bank contacts 7. The intermediate bank contacts represent frequency increments of 0.1 mHz. so that the oscillator output in the illustrated wiper position has a frequency $f_n$ of 5.2 mHz. Phase discriminator 5 is of a type which differentiates the incoming reference frequency $f_o$ and converts it into a train of sharp pulses, producing no output voltage whenever these pulses precisely coincide with an inversion point of the high-frequency wave $f_n$ from oscillator 3 which in this case must be an exact harmonic of the reference frequency; if the harmonic relationship obtains but the pulses from the reference oscillation do not coincide with the inversion points of the 5.2 mHz. wave $f_n$, the output of phase discriminator 5 will be a constant D-C voltage supplementing the selector voltage to compensate for minor deviations of the latter from the value required to keep the oscillator 3 working at the selected multiple of reference frequency $f_0$.

Oscillator 1, in response to the control voltage from circuit 4, is pretuned to a frequency on the order of 5.7 mHz. When the system is first placed in operation, or upon a readjustment of selector 6, the algebraic combination of output frequency $f_{out}$ with the operating frequency of 5.2 mHz. from oscillator 3 will thus produce a resultant frequency which differs from the output frequency of divider 10 (0.52 mHz.) in the second and lower decimals. This difference will be small enough to generate in the output of discriminator 9 a voltage varying at such a slow rate that, with proper damping to minimize or eliminate hunting, oscillator 1 is returned substantially periodically until its output frequency has the exact magnitude of 5.742 mHz. From this point on the control voltage from discriminator 9 remains constant, as explained above, at a level which maintains the desired tuning of oscillator 1 and which also perpetuates the corresponding phase difference between the two isofrequent oscillations in the input of this phase discriminator.

Figure 3:
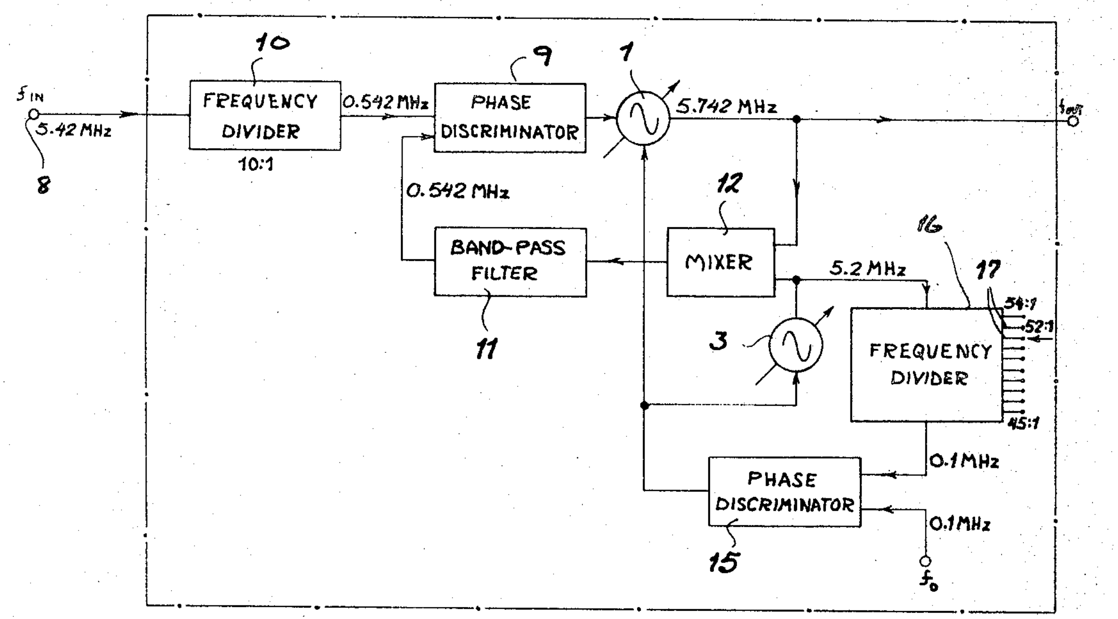
FIG. 3 is a circuit diagram similar to FIG. 2, showing a modification.

Because the phase discriminator 5 of FIG. 2 can compensate only to a minor extent for deviations of the output voltages of selector 6 from their rated values, this selector must be designed to relatively close tolerances. A less stringent tolerance requirement exists in the modified system of FIG. 3 which differs from that of FIG. 2 in the substitution of selector 6 by a frequency divider 16 with a bank of input terminals 17, the output of this frequency divider being supplied along with reference frequency $f_0$ to a phase discriminator 15 which energizes the control circuit 4 for oscillators 1 and 3. Frequency divider 16 can be set to any one of ten stepdown ratios ranging, in steps of 0.1 mHz., from 45:1 to 54:1, the selected ratio corresponding to the harmonic relationship between the desired output frequency $f_n$ of oscillator 3 and the reference frequency $f_0$. Thus, with the selector wiper 106 again placed on the No. 7 bank contact 17, the stepdown ratio of frequency divider 16 will be 52:1 and, as soon as oscillator 3 reaches its steady-state operating frequency of 5.2 mHz., the output of divider 16 will have the same frequency as reference oscillation $f_0$ so that a constant feedback voltage appears on conductor 4 to stabilize oscillator 3 and to pretune oscillator 1 as described above. It will be apparent that in this case the oscillator 15 may be of a simple type merely capable of comparing the phases of two input frequencies having the same order of magnitude.

If the phase discriminators 9 and 5 or 15 cannot be conveniently damped to a sufficient extent to enable the lock-in of the associated oscillators at the desired frequencies from any starting condition, they may be supplemented by frequency-difference detectors connected in parallel therewith as illustrated in FIG. 4. The two $\Delta f$ detectors 19 and 20, respectively bridged across discriminators 15 and 9, may each consist of two conventional frequency discriminators whose output voltages are differentially combined to produce a resultant control voltage substantially proportional to the difference between its input frequencies; as these frequencies approach each other, the output of the detector becomes insignificant at a point where the associated phase discriminator generates an output voltage varying substantially linearly with the phase difference in the input. During steady-state operation, therefore, the $\Delta f$ detectors 19, 20 are functionless, incipient deviations from the selected oscillator frequencies being again counteracted solely by the corresponding phase discriminators as described above.

FIG. 4 also illustrates a switch 21 facilitating changeovers from the aforedescribed locking-in position to a monitoring position. A source of sawtooth voltage 22, normally inoperative, is connectable by an armature **21*a* of switch 21 to one of the inputs of oscillator 1 which is simultaneously disconnected from phase discriminator 9 by another armature 21*b* arranged to apply the discriminator output instead to an indicator 28, shown as an oscilloscope screen, via a mixer 24 and a detector 27. A low-pass filter 26 between switch 21 and oscillator 1 eliminates the alternating voltage in the discriminator output, within the range of effectiveness of $\Delta f$ detector 20, when armature 21*b* is in its alternate (lock-in) position. A similar low-pass filter may be included in the output of phase discriminator 15. Sawtooth generator 22 is synchronized with the horizontal sweep circuit of oscilloscope 28**.

With suitable choice of the amplitude range of sawtooth generator 22, oscillator 1 can be wobbled so that its frequency varies over a band of 0.1 mHz, equaling the fine-tuning range of network 12, 11, 9, 20, 26. The unfiltered output of phase discriminator 9 changes then, during one sawtooth cycle, from 42 kHz. through 0 (with 180° phase shift) to 47 kHz. and, as passed by mixer 24 (in the absence of any other input to the latter) and detector 27, produces on oscilloscope 28 a trace 29 with a zero point 30 at the 42-kHz. mark. This enables verification of the last two digits of the output frequency $f_{out}$ produced during steady-state operation of the system. For further calibration, mixer 24 may receive one of nine discrete frequencies of 1, 2, . . . 9 kHz. from a stepwise adjustable oscillator 25 so that additional zero markings 30′ or 30″ can be obtained at 02, 12, 22, 32 kHz. (with differential mixing) or at 52, 62, 72, 82, 92 kHz. (with additive mixing). The feedback loop existing from the output of oscillator 1 via circuits 12, 11 and 20 helps linearize the response of the oscillator to the control voltage from sawtooth generator 22.

Finally, the monitoring position of switch 21 in FIG. 4 can be used for reading out the last digit or digits of an input frequency $f_{in}$ if the converter stage forms part of a telemetric analyzer or receiver rather than a synthesizer or transmitter. Thus, let us assume that the frequency $N^{IV}$=5,831,742 Hz. is supplied at terminal 8, that selector 106 is for convenience only on the No. 0 bank contact to stabilize the output of oscillator 3 at 4.5 mHz. while correspondingly pretuning the oscillator 1 to 5 mHz. and that sawtooth generator 22 wobbles this oscillator between 5,083,174.0 and 5,083,174.9 Hz. (the 0 in the sixth decade being the digit introduced by the setting of selector 106). Then, a zero signal will appear at mark 2 Hz. (one a scale ranging from 0 to 10 Hz.) whenever the output of oscillator 1 passes through 5,083,174.2 Hz. In analogous manner, the tens digit "4" (40 Hz.) can be read on a similar indicator of a subsequent stage, and by the same token the four remaining significant digits of $f_{in}$ will be ascertainable in as many further stages. The output frequency of the final stage will have the numerical value 5,*xxx,xxx*.83174 Hz. where "*x*" denotes the digits introduced by the arbitrary settings of the respective frequency selectors. Naturally, under the assumed conditions, each stage will be required to discriminate only between unit values of the first decimal of its output frequency so that the following decimals will be without significance.

It will thus be seen that I have devised a circuit arrangement which, while being primarily intended for decadic switching stages, lends itself to any kind of digital system and is applicable wherever a desired output frequency $f_{out}$ is to be synthesized from a variable minor constituent (output of frequency divider 10) and a selectable major constituent (output of oscillator 3).

I claim:

1. A denominational switching stage for converting a given input frequency, expressed as a multidigit number N with $k$ significant digits preceded by at least one invariable digit, into an output frequency, expressed as a multidigit number N′ of like order of magnitude with $k+1$ significant digits preceded by the same invariable digit, by shifting each of said $k$ signficant digits into the next-lower denominational order and introducing a selected further digit in the thus-vacated denominational order and introducing a selected further digit in the thus-vacated denominational order immediately following said invariable digit, comprising:

an incoming line for said input frequency;

an outgoing line for said output frequency;

frequency-divider means in said incoming line with a stepdown ratio of $n$:1 where $n$ is the denominational base of said multidigit numbers;

voltage-responsive first variable oscillator means having an output connected to said outgoing line, said first oscillator means having an operating frequency ranging between a lower limit $f_1$, corresponding to said multidigit number N with all characteristic digits thereof equaling zero, and an upper limit $f_2$, corresponding to said multidigit number N with all characteristic digits thereof equaling $n-1$;

second variable oscillator means;

selector means for adjusting said second oscillator means to one of $n$ discrete frequencies $f_n$ ranging in digital steps between $(n-1)f_1/n$ and $(n-1)f_2/n$;

mixer means connected to the outputs of said first and second oscillator means for deriving therefrom a difference frequency which equal $1/n$ times said input frequency upon the operating frequency of said first oscillator means equaling said output freqnency;

an phase-discriminator means connected to the outputs of said mixer means and said frequency-divider means for applying to said first oscillator means a substantially constant control voltage maintaining the operating frequency thereof at a numerical value N' during steady-state operation.

2. A switching stage as defined in claim 1 wherein said second oscillator means comprises a voltage-responsive oscillation generator, a source of a stabilized reference frequency $f_o$ equal to the increments between said $n$ discrete frequencies, and phase-comparison means connected to the outputs of said source and of said oscillation generator for applying to the latter a feedback voltage maintaining the operating frequency thereof at a value determined by the setting of said selector means.

3. A switching stage as defined in claim 2, further comprising circuit means for applying said feedback voltage to said first oscillator means for presetting same to an operating frequency on the order of $(n+1)/n$ times the operating frequency of said oscillation generator.

4. A switching stage as defined in claim 3 wherein said selector means comprises a frequency divider between said phase-comparison means and the output of said oscillation generator adjustable to one of $n$ different stepdown ratios $p$:1, $p$ being equal to $f_n/f_o$.

5. A switching stage as defined in claim 3, further comprising a frequency-difference detector connected in parallel with said phase-discriminator means for producing transient control voltages for said first oscillator means prior to attainment of steady-state operation.

6. A switching stage as defined in claim 5, further comprising a variable-voltage source with a range of magnitudes capable of varying the operating frequency of said first oscillator means over a range equal to a unit of a denominational order occupied by a significant digit, frequency-indicating means, and switchover means operable to connect said variable-voltage source to an input of said first oscillator means while simultaneously connecting the output of said phase-discriminator means to said frequency-indicating means to produce a monitoring signal upon the operating frequency of said first oscillator means passing through a value equal to said output frequency.

7. A switching stage as defined in claim 6 wherein said frequency-indicating means includes a source of predetermined frequencies harmonically related to said unit and additional mixer means for combining said predetermined frequencies with the output of said phase-discriminator means to produce a spectrum of further monitoring signals.

8. A switching stage as defined in claim 5, further comprising another frequency-difference detector connected in parallel with said phase-comparison means for producing transient control voltages for said oscillation generator prior to attainment of steady-state operation.

9. A switching stage as defined in claim 1 wherein $n$ equals 10.

10. A system for producing a stabilized oscillation of selected output frequency, comprising input means for producing a variable minor constituent of said output frequency, voltage-responsive generator means for producing a major constituent of said output frequency, selector means for producing a control voltage for said generator means determining the magnitude of said major constituent, voltage-responsive variable oscillator means tunable to said output frequency, circuit means for applying said control voltage to an input of said oscillator means for presetting same to an operating frequency on the order of the selected output frequency within the range of variation of said minor constituent, mixer means connected to said generator means and said oscillator means for algebraically combining their outputs into a resultant frequency close to said minor constituent, and means including a phase discriminator connected to receive said minor constituent from said input means and said resultant frequency from said mixer means for applying to said generator means a supplemental voltage tuning same to the selected output frequency.

References Cited

UNITED STATES PATENTS

| | | | |
|---|---|---|---|
| 2,248,442 | 7/1941 | Stocker | 328—15 X |
| 3,023,370 | 2/1962 | Waller. | |
| 3,334,305 | 8/1967 | Yen | 328—15 X |

RUDOLPH V. ROLINEC, *Primary Examiner.*

P. F. WILLE, *Assistant Examiner.*

U.S. Cl. X.R.

328—14